US010998867B2

(12) United States Patent
Hoff et al.

(10) Patent No.: US 10,998,867 B2
(45) Date of Patent: May 4, 2021

(54) AVOIDING CLIPPING IN AUDIO POWER DELIVERY BY PREDICTING AVAILABLE POWER SUPPLY ENERGY

(71) Applicant: CIRRUS LOGIC INTERNATIONAL SEMICONDUCTOR, LTD., Edinburgh (GB)

(72) Inventors: Thomas Hoff, Austin, TX (US); Eric J. King, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 0 days.

(21) Appl. No.: 16/846,335

(22) Filed: Apr. 11, 2020

(65) Prior Publication Data
US 2020/0382078 A1 Dec. 3, 2020

Related U.S. Application Data

(60) Provisional application No. 62/854,033, filed on May 29, 2019.

(51) Int. Cl.
*H03F 3/181* (2006.01)
*H04R 3/00* (2006.01)

(52) U.S. Cl.
CPC ............ *H03F 3/181* (2013.01); *H04R 3/00* (2013.01); *H03F 2200/03* (2013.01)

(58) Field of Classification Search
CPC ...... G10L 21/0208; G10L 2021/02165; H04R 3/00; H04R 3/005; H04R 2410/07; G11B 20/02; G11B 20/24; G11B 20/10527; H03G 3/348; H03G 3/345; H03G 11/00; H03G 9/025; H03F 1/26; H03F 1/305; H03F 3/20; H03F 3/181; H03F 2200/03; (Continued)

(56) References Cited

U.S. PATENT DOCUMENTS

| 7,327,850 B2 * | 2/2008 | Crump .................. H02M 3/156 381/323 |
| 7,888,907 B2 | 2/2011 | Litovsky et al. |
| 8,311,243 B2 | 11/2012 | Tucker et al. |

(Continued)

OTHER PUBLICATIONS

U.S. Appl. No. 16/745,511, filed Jan. 17, 2020, May, et al.
(Continued)

*Primary Examiner* — Ahmad F. Matar
*Assistant Examiner* — Sabrina Diaz
(74) *Attorney, Agent, or Firm* — Mitch Harris, Atty at Law, LLC; Andrew M. Harris

(57) ABSTRACT

A power output circuit supplies an audio power output signal that is adjusted to prevent clipping when needed based on an estimate of available energy from the power supply supplying the power output circuit. The power output circuit may be an audio power output circuit that generates an audio power output signal from samples of an audio program that are stored in a buffer. A processing block determines an energy requirement for producing the audio power output signal from the audio program and adjusts an amplitude of the audio power output signal in conformity with the determined energy requirement and an available energy determined for the power supply so that the audio power output signal is reproduced without clipping of the audio power output signal.

21 Claims, 5 Drawing Sheets

(58) Field of Classification Search
CPC ......... H03F 2200/105; H03F 2200/195; H03F 2200/201; H03F 2200/207; H04B 1/1027
USPC ..................................... 381/94.5, 94.1, 94.8
See application file for complete search history.

(56) References Cited

U.S. PATENT DOCUMENTS

| | | |
|---|---|---|
| 9,231,543 B2 | 1/2016 | Hogan et al. |
| 9,614,486 B1 | 4/2017 | Yang et al. |
| 10,187,025 B1 | 1/2019 | May et al. |
| 10,243,524 B2 | 3/2019 | Orr |
| 10,469,044 B1 * | 11/2019 | Hollabaugh ........... H03G 3/007 |
| 2015/0061778 A1 * | 3/2015 | Tsuji ....................... H03F 3/195 |
| | | 330/297 |
| 2017/0142518 A1 * | 5/2017 | May ....................... H03G 3/007 |
| 2019/0181811 A1 | 6/2019 | Orr |

OTHER PUBLICATIONS

International Search Report and Written Opinion in PCT/US2020/034202 dated Aug. 14, 2020, 14 pages (pp. 1-14 in pdf).

\* cited by examiner

AVOIDING CLIPPING IN AUDIO POWER DELIVERY BY PREDICTING AVAILABLE POWER SUPPLY ENERGY

The present application Claims priority under 35 U.S.C. § 119(e) to U.S. Provisional Patent Application 62/854,033 filed on May 29, 2019, the disclosure of which is incorporated herein by reference.

BACKGROUND

1. Field of Disclosure

The field of representative embodiments of this disclosure relates to audio or other power output methods, circuits and systems that have limited power supply capabilities and/or constrain the current/power supplied to one or more power output circuits.

2. Background

Audio output stages that deliver power to an acoustic output transducer, e.g., a micro speaker or loudspeaker are frequently a large consumer of energy in energy-limited devices such as mobile telephones and other personal audio devices. If insufficient voltage is available to deliver the instantaneous audio power output signal at the full linear-scaled voltage waveform corresponding to the input program material, then distortion, i.e., "clipping" is the result. Various techniques have been provided for preventing such distortion, such as schemes that boost the power supply voltage momentarily, e.g., so-called "class G" and "class H" amplifiers, so that while momentary energy demand is increased, peaks of the output waveform can be reproduced accurately. In some implementations, the amplitude of the output waveform is reduced while the boosting action raises the power supply voltage.

However, such power-only or amplitude-only solutions only consider a present state of available voltage and current and do not consider the future state of the power supply voltage, leading to inaccuracies.

Therefore, it would be advantageous to provide an improved performance in audio power output circuits, in particular when the audio power output circuits share a power supply with other circuits.

SUMMARY

Improved operation of audio circuits and systems may be accomplished in amplifier/signal processing systems and amplifier circuits and their methods of operation.

The methods, systems and circuits supply a power output signal from an output circuit. The power output circuit generates the power output signal from samples of an input program that are stored in a buffer. A processing block determines an energy requirement for producing the power output signal from the input program and adjusts an amplitude of the power output signal in conformity with the determined energy requirement and an available energy determined for the power supply so that the power output signal is reproduced without clipping of the audio power output signal. The power output signal may be an audio signal and the input program may be an audio input program. Alternatively, the power output signal may be one for driving another electromechanical output transducer, such as a haptic feedback device.

The summary above is provided for brief explanation and does not restrict the scope of the Claims. The description below sets forth example embodiments according to this disclosure. Further embodiments and implementations will be apparent to those having ordinary skill in the art. Persons having ordinary skill in the art will recognize that various equivalent techniques may be applied in lieu of, or in conjunction with, the embodiments discussed below, and all such equivalents are encompassed by the present disclosure.

DESCRIPTION OF ILLUSTRATIVE EMBODIMENT

The present disclosure encompasses methods, systems and circuits that control the generation of an audio power output signal according to energy measurements associated with a power supply in order to prevent clipping or other distortion of the audio power output signal waveform. The techniques use measurements of the power supply output voltage, the power supply input voltage (e.g., battery terminal voltage), a current limit value provided by the power supply and the value of the power supply output capacitance to calculate the available energy as the sum of the stored energy in the power supply output capacitance and the energy transfer available through the power supply. The available energy is compared to a calculated energy needed to deliver the output voltage waveform to the connected audio output transducer(s) based on samples of an audio program input stored in a buffer that delays the audio input program. If the available energy is insufficient to meet the output voltage waveform requirement for the samples in the buffer, the amplitude of the audio input program is reduced to generate an output voltage waveform that will not cause a demand exceeding the available energy, preventing clipping of the output voltage waveform. The value of the power supply output capacitance may be updated via a computation based on conservation of power between the power supply input, the power supplied to generate the audio power output signal, and power due to removal of energy from the output capacitance. The techniques described herein may be applied to other power output circuits, such as those that drive electromechanical devices such as haptic feedback devices.

Figure 1:
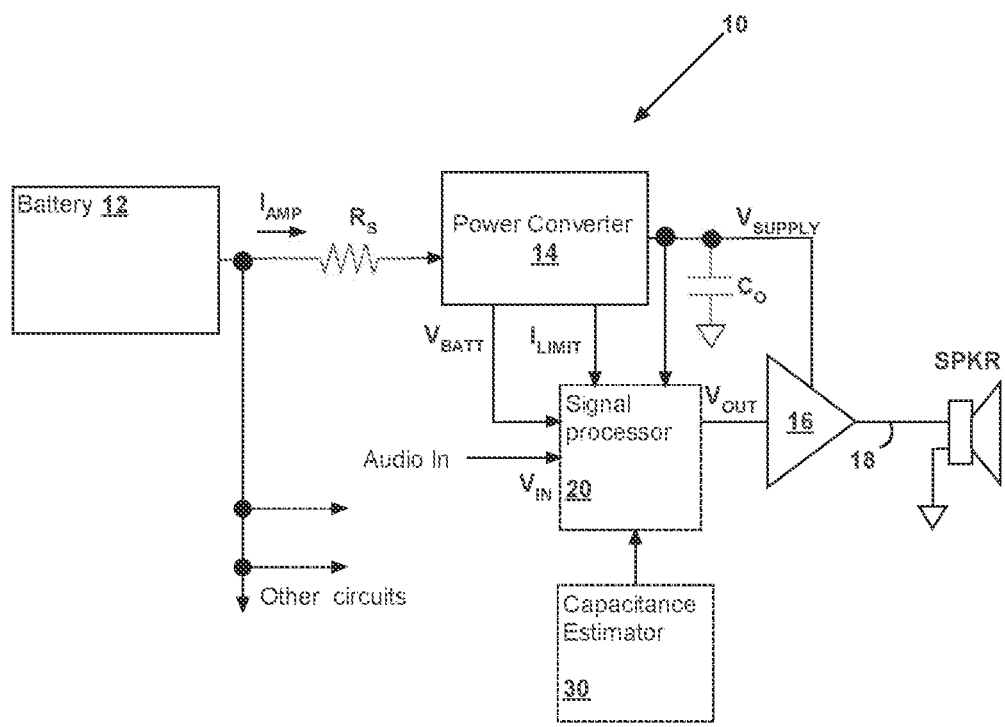
FIG. 1 is a block diagram of a system in which techniques according to an embodiment of the present disclosure are practiced.

FIG. 1 shows a block diagram of an example amplifier system and circuit 10 in which techniques according to an embodiment of the disclosure are practiced. A power converter 14 delivers operating voltage $V_{SUPPLY}$ to an amplifier 16, which generates an output voltage waveform 18, which is ultimately delivered to an audio output transducer, such as a micro speaker or loudspeaker SPKR. Alternatively, the audio output transducer may be a haptic feedback device such as a linear resonant actuator (LRA) or eccentric rotating mass (ERM). Across the output of power converter 14 is an output capacitance $C_O$, which represents the total parallel output capacitance at the output of power converter 14 including the effective output capacitance of any switching circuits in power converter 14 and any externally connected filter capacitance, etc. The input of power converter 14 is shown connected to a battery 12, but the techniques herein may be applied to any source of power suitable for providing input voltage/current to power converter 14. A series resistance $R_S$ represents the series internal resistance of battery 12 and associated external circuit resistance, which causes reduction in a battery terminal voltage $V_{BATT}$ and thus the energy/power delivered from battery 12 to power converter 14. In the illustrated system, if the terminal voltage $V_{BATT}$ of battery 12 is reduced with an active current limit provided by power converter 14, the current that may be drawn by the battery-powered circuits including power converter 14 is reduced, which could cause an eventual reduction in the output voltage $V_{SUPPLY}$ of power converter 14, which is the voltage across output capacitance $C_O$. The above-described condition can occur when the output power delivered by amplifier 16 is greater than the input power supplied to power converter 14. If voltage $V_{SUPPLY}$ falls below the power supply voltage needed to reproduce the output voltage waveform at speaker SPKR, which is generally the amplitude of output voltage waveform 18 plus a voltage drop due to the output resistance of transistors generating the output of amplifier 16, then output voltage waveform 18 will be clipped at the maximum amplitude until the input signal falls in amplitude so that output voltage waveform 18 may again be generated at full peak voltage.

In order to prevent clipping of the output voltage waveform, a signal processor 20 provides a processing subsystem that controls the amplitude of a signal $V_{OUT}$ that is provided to the input of amplifier 16, so that when signal processor 20 determines that the energy demanded by full reproduction of input signal $V_{IN}$ is greater than a measure of available energy, signal processor 20 reduces the amplitude of signal $V_{OUT}$, so that clipping of output voltage waveform 18 does not occur. Details of signal processor 20 are omitted for clarity, but will be described in further detail below with reference to the other Figures. The reduction reduces a gain or increases an attenuation applied to input signal $V_{IN}$, i.e., signal processor compresses the amplitude of signal $V_{OUT}$ uniformly with respect to both polarities of signal $V_{OUT}$, so that clipping and asymmetric distortion is prevented. Signal processor 20 receives values of battery terminal voltage $V_{BATT}$ from power converter 14. It is understood that the above-described techniques may also prevent non-linear distortion from amplifier 16 that may occur rather than clipping when output voltage $V_{SUPPLY}$ of power converter 14 approaches the voltage that output voltage waveform 18 would assume without gain reduction by signal processor 20 by including an offset in the energy demanded to accommodate any additional voltage needed at the power supply input to amplifier 16. Signal processor 20 requires a value of output capacitance $C_O$, in order to determine the portion of available energy stored in output capacitance $C_O$, which may be a predetermined value, but in some embodiments of the disclosure includes a capacitance estimator 30 that determines a value of output capacitance $C_O$ from measurements within the circuit of FIG. 1 and which will be described in further detail below with reference to FIG. 3. Capacitance estimator 30 also receives the input signals provided to signal processor 20, which will be disclosed in further detail below and have been omitted from FIG. 1 for clarity.

While the following description is provided with reference to a block diagram, it is understood that the description and the calculations included therein are applicable to a process that may be implemented by a digital signal processor executing a computer program product according to an embodiment of the disclosure as described in further detail below. Further, the disclosed embodiment is a discrete-time embodiment that calculates energy values and power values as sequences based on sequential values of voltage measurements and input samples. "Continuous" as used herein includes discrete-time sampled processes that update values periodically as a sequence of values, generally at a predetermined sample rate.

Figure 2:
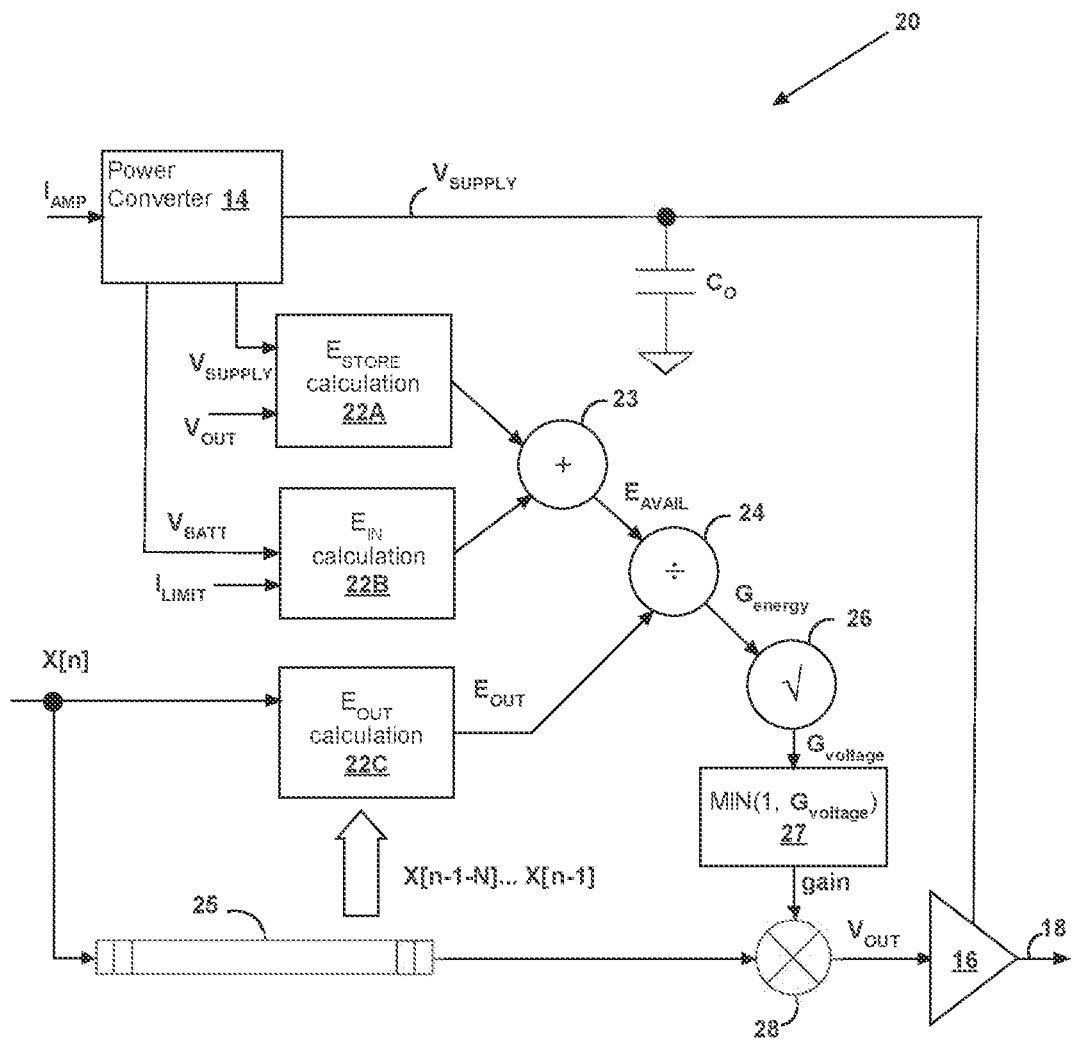
FIG. 2 is a block diagram illustrating processing within signal processing block 20 of FIG. 1.

FIG. 2 is a block diagram depicting a process of gain control as applied to signal $V_{OUT}$ by signal processor 20 in the circuit of FIG. 1. Power converter 14 receives power supply input current $I_{AMP}$ and generates a power converter output voltage $V_{SUPPLY}$, which is provided to amplifier 16. A calculation of available energy $E_{AVAIL}$ is performed by summing operation 23, which adds a calculated value of the stored energy $E_{STORE}$ determined by $E_{STORE}$ calculation block 22A with a calculated value of the maximum energy input that is available to power converter $E_{IN}$ calculated by $E_{IN}$ calculation block 22B. A demanded energy $E_{OUT}$ that would be required to generate the output voltage waveform 18, at full-scale, over samples x[n] of audio input $V_{IN}$ that are stored in a buffer 25, is calculated by $E_{OUT}$ calculation block 22C, and an energy ratio $G_{energy}$ is computed by dividing available energy $E_{AVAIL}$ by energy demand $E_{OUT}$. Since the energy of output voltage waveform 18 over time is proportional to the square of the voltage of output voltage waveform 18, a square root computation 26 is performed on energy ratio $G_{energy}$ to obtain a voltage ratio $G_{voltage}$, which is a ratio of the desired amplitude of output voltage waveform 18 to avoid clipping to the full-scale amplitude of output voltage waveform based on audio input $V_{IN}$. To avoid expanding output voltage waveform 18 beyond unity gain, a ceiling computation 27 is performed to take the minimum of voltage ratio $G_{voltage}$ and unity: $MIN(1, G_{voltage})$, so that an output gain is never greater than unity. A gain control block is provided by multiplier 28 which scales the samples x[n] of audio input $V_{IN}$ by output gain of ceiling computation 27 in order to reduce the amplitude of output voltage waveform 18 when available energy $E_{AVAIL}$ is less than energy demand $E_{OUT}$.

The energy calculations performed by energy calculation blocks 22A-22C are based on measurements and provided values. $E_{STORE}$ is not the total energy stored in output capacitance $C_O$, but is the difference between the total energy stored in output capacitance $C_O$, and the energy stored in output capacitance $C_O$ when the value of power converter output voltage $V_{SUPPLY}$ is equal to that required to produce the instantaneous value of output voltage waveform 18 without clipping. Therefore, $E_{STORE}$ calculation block 22A computes the stored energy as:

$$E_{STORE}=\tfrac{1}{2}C_O(V_{SUPPLY}^2-V_{OUT}^2),$$

$E_{IN}$ calculation block 22B computes the maximum available input energy that can be drawn by power converter 24 from the input power source from a predefined current limit value Limn and the actual terminal voltage $V_{BATT}$ of the battery or other source supplying energy to power converter 24. $E_{OUT}$ calculation block 22C calculates demanded energy $E_{OUT}$ from samples x[n] of audio input $V_{IN}$ by integrating the power corresponding to the individual samples on a continuous basis, i.e., $$E_{OUT}=k\Sigma_n^{n-1-N}x^2[n]/R_O,$$

where $R_O$ is the load impedance of the load connected to the output of amplifier 16 and k is any gain or attenuation factor between samples x[n] and amplifier output waveform 18. Given the above values computed by energy calculation blocks 22A-22C, the ratio of available energy $E_{AVAIL}$ to demanded output energy $E_{OUT}$ is computed and the gain/attenuation factor gain set as described above.

Figure 3:
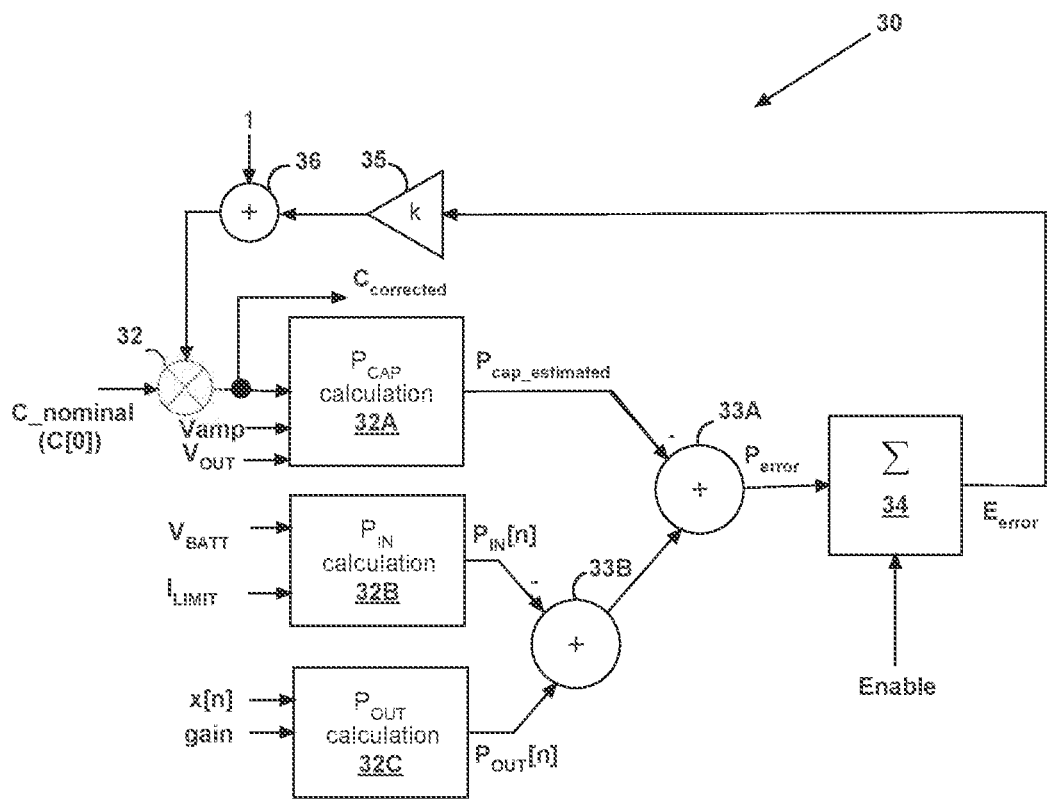
FIG. 3 is a block diagram illustrating processing within capacitance estimator 30 of FIG. 1.

FIG. 3 shows details of computations within capacitance estimator 30 within example amplifier system and circuit 10 of FIG. 1. The value of output capacitance $C_O$ is estimated using power calculations according to the conservation of power within example amplifier system and circuit 10 of FIG. 1, during periods when the conservation of power is accurate, which in the disclosed embodiment is during periods when power converter 14 is current-limited as will be described below. During and across the above-described periods, the value of the estimated output capacitance $C_O$ is updated continuously, so that variations in the estimated output capacitance $C_O$ are tracked over time and temperature. The power $P_{CAP}$ provided from output capacitance $C_O$ is calculated by $P_{CAP}$ calculation block 32A and the power $P_{IN}[n]$ provided to power converter 24 is calculated by $P_{IN}$ calculation block 32B, and which is given by:

$$P_{IN}[n]=V_{BATT}[n]I_{LIMIT}[n].$$

The output power $P_{OUT}[n]$ provided by amplifier 16 is computed by $P_{OUT}$ calculation block 32C, which can be computed as:

$$P_{OUT}[n]=V_{OUT}^2/R_L,$$

where $R_L$ is the load impedance at the output of amplifier 16, and $$P_{OUT}[n]=V_{OUT}^2/R_L=(\text{gain } x[n])^2/R_L.$$

A subtraction operation 33B calculates the power that is removed from output capacitance $C_O$ by subtracting power converter 14 input power $P_{IN}[n]$ from output power $P_{OUT}[n]$ and subtraction operation 33A computes a power error $P_{error}$ due to error in the estimate of output capacitance $C_O$, by subtracting the computed power $P_{CAP}$ provided from output capacitance $C_O$. An accumulator 34 accumulates the computed power error $P_{ERROR}$ to generate an energy error $E_{error}$. Since, as described in more detail below, the power converter input power $P_{IN}[n]$ is determined from the power supply current limit value $I_{LIMIT}$, accumulator 24 is enabled for update by a control signal calculate_enable, which ensures that capacitance estimator is only updated when the input of power converter 24 is current-limited. Energy error $E_{ERROR}$ is scaled by a scaling operation 35 and adder 36 scale the computed error by a factor (k+1). The error factor is multiplied by a nominal estimated starting capacitance value c_nominal by a multiplier 32, so that a corrected capacitance value $C_{corrected}$ is produced that can be used in further computations by $E_{STORE}$ calculation block 22A of FIG. 2.

The power calculations performed by power calculation blocks 32A-32C are based on measurements and provided values. The actual output power sequence $P_{OUT}$ is computed by $P_{OUT}$ calculation block 32C from input samples x[n] and the load resistance at the output of amplifier 16, as described above. The input power sequence is computed as described above by multiplying the current limit value LIMIT by the terminal voltage $V_{BATT}$ of the battery or other input power source. The power provided by draining energy from output capacitance $C_O$ is computed as:

$$P_{CAP}[n] = V_{SUPPLY}[n]I_{CAP[n]} = V_{SUPPLY}C_O[n]\frac{dV_{SUPPLY}[n]}{dt},$$

which can be computed from finite differences between the sample values of power supply output voltage $V_{SUPPLY}$ and the instant estimate of output capacitance $C_O$: C[n].

Figure 4:
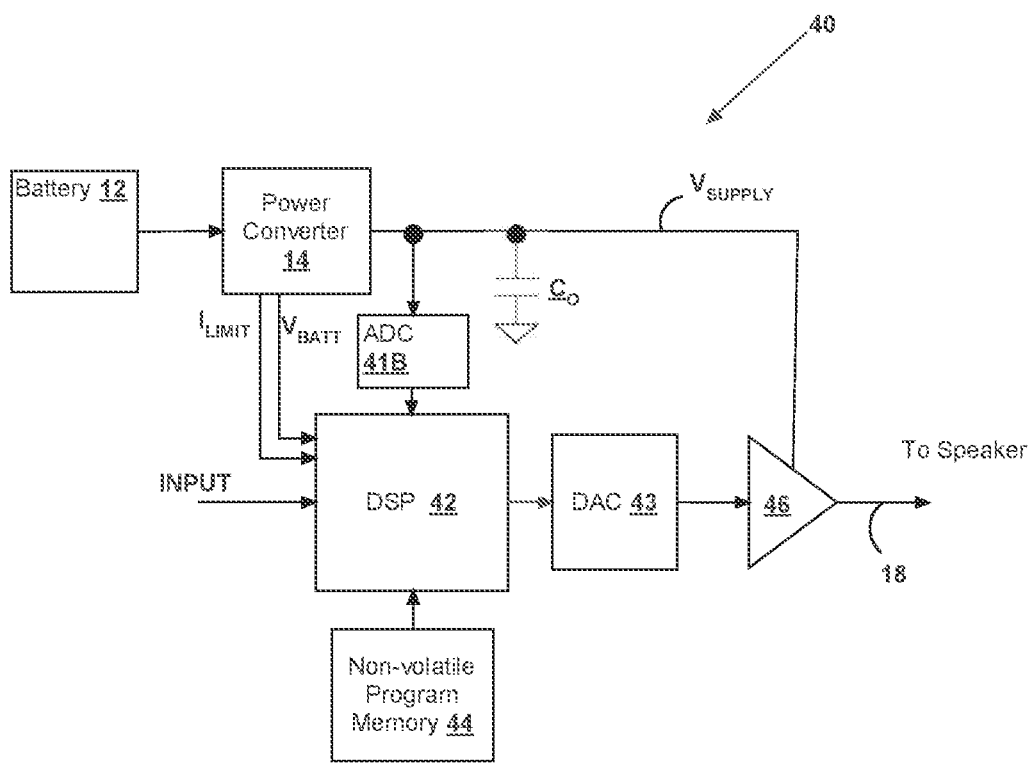
FIG. 4 is a block diagram of a system in which techniques according to an embodiment of the present disclosure are practiced.

Referring now to FIG. 4, a digital signal processing system is shown, which can be used to implement the techniques of the present disclosure. A digital signal processor (DSP) 42 (or a suitable general-purpose processor) executes program instructions stored in a non-volatile memory 44 and that form a computer-program product in accordance with the present disclosure. DSP 42 receives samples of the audio input signal $V_{IN}$ at an input INPUT from a program source, such as a CODEC. DSP 42 also receives samples of output voltage $V_{SUPPLY}$ of power converter 14 from an ADC 41B, which serves as a voltage measurement circuit, and the values of current limit Limn and battery terminal voltage $V_{BATT}$ of battery 12 from power converter 14. A digital-to-analog converter (DAC) 43 receives output values corresponding to the processed amplifier output signal $V_{OUT}$, which represent audio input samples that have been processed according to the processes described with reference to FIG. 2 and FIG. 3, to prevent clipping or other distortion due to insufficient energy available from power converter 14 and output capacitance $C_O$. DAC 43 provides output signal $V_{OUT}$ to an amplifier 46, which generates output voltage waveform 18. Alternatively, DSP 42 may provide samples to a pulse-width modulator (PWM) (class-D) type amplifier or generate PWM signals directly provided to switching circuits that are supplied with supply voltage $V_{SUPPLY}$ provided by power converter 14 and output capacitance $C_O$.

Figure 5:
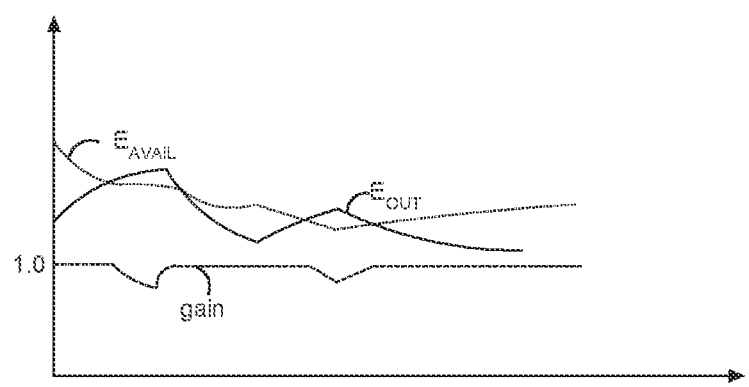
FIG. 5 is a graph depicting operation of the systems illustrated herein.

Referring to FIG. 5, a graph shows an example operation of the amplifier described above with reference to FIGS. 1-4. The available energy $E_{AVAIL}$ is shown occasionally dropping below the demanded energy $E_{OUT}$ and the value gain is lowered by the action of the above-described processing for these intervals so that clipping of the output voltage waveform 18 does not occur.

As mentioned above portions or all of the disclosed process may be carried out by the execution of a collection of program instructions forming a computer program product stored on a non-volatile memory, but that also exist outside of the non-volatile memory in tangible forms of storage forming a computer-readable storage medium. The computer-readable storage medium may be, for example, but is not limited to, an electronic storage device, a magnetic storage device, an optical storage device, an electromagnetic storage device, a semiconductor storage device, or any suitable combination of the foregoing. Specific examples of the computer-readable storage medium includes the following: a hard disk, semiconductor volatile and non-volatile memory devices, a portable compact disc read-only memory (CD-ROM) or a digital versatile disk (DVD), a memory stick, a floppy disk or other suitable storage device not specifically enumerated. A computer-readable storage medium, as used herein, is not to be construed as being transitory signals, such as transmission line or radio waves or electrical signals transmitted through a wire. It is understood that blocks of the block diagrams described above may be implemented by computer-readable program instructions. These computer readable program instructions may also be stored in other storage forms as mentioned above and may be downloaded into a non-volatile memory for execution therefrom. However, the collection of instructions stored on media other than system non-volatile memory described above also form a computer program product that is an article of manufacture including instructions which implement aspects of the functions/actions specified in the block diagram block or blocks.

In summary, the instant disclosure discloses a power output circuit that supplies a power output signal that is adjusted to prevent clipping when needed based on an estimate of available energy from the power supply supplying the amplifier. The power output circuit generates the power output signal from samples of the program that are stored in a buffer. A processing block determines an energy requirement for producing the power output signal from the program and adjusts an amplitude of the power output signal in conformity with the determined energy requirement and an available energy determined for the power supply so that the power output signal is reproduced without clipping of the power output signal. The system provides a power output signal to an output transducer based on a program and includes a power supply, a buffer for storing samples of the program, a power output circuit that generates the power output signal from the samples of the program, and a processing subsystem that determines an energy requirement for producing the power output signal from the program and adjusts an amplitude of the power output signal in conformity with the determined energy requirement and an available energy determined for the power supply so that the power output signal is reproduced without clipping of the power output signal. The program may be an audio program and the power output signal an audio power output signal. Alternatively, the power output signal may be a signal for driving another electromechanical output transducer, such as a haptic feedback device.

The processing subsystem may determine an energy available from the power supply circuit by determining a stored energy in an output storage capacitance of the power supply, determining an input energy available to an input of the power supply, and combining the input energy available to the input of the power supply circuit and the stored energy in the output storage capacitance to determine an energy available to the power output circuit. The processing subsystem adjusts the amplitude of the power output signal in conformity with the determined energy available to the power output circuit. The processing subsystem may calculate the energy requirement based upon the samples of the input signal stored in the buffer and compare the energy requirement to the energy available to the power output circuit to determine a gain or attenuation value to apply to the power output signal. The processing subsystem may also estimate a capacitance value of the output storage capacitance and determine the stored energy in the output storage capacitance using the estimated capacitance value. The processing subsystem may compute the capacitance value from conservation of a power supplied from the output storage capacitance, a power supplied to the input of the power supply, and a power supplied to the power output circuit. The system may further include a voltage measuring circuit for measuring a voltage across the output storage capacitance and determine the power supplied from the output storage capacitance from the computed capacitance value and changes in the measured voltage. The processing subsystem may compute the power supplied to the input of the power supply from a current limit value of the power supply and from a voltage across the input of the power supply while the input of the power supply is in a current-limited condition, and may compute the capacitance value only while the power supply is in a current-limited condition. The processing subsystem may further determine an error in the estimated capacitance value by subtracting the power supplied to the input of the power supply and the power supplied from the capacitor, according to the estimated capacitance, from power values representing power delivered to the power output circuit. The processing system may then accumulate a result of the subtracting to produce an energy error value, and update the estimated capacitance value in conformity with the energy error value. The processing subsystem may update the estimated capacitance value so that variation in the capacitance of the output storage capacitance is modeled over time and compensated for when determining the energy available from the power supply.

While the disclosure has shown and described particular embodiments of the techniques disclosed herein, it will be understood by those skilled in the art that the foregoing and other changes in form, and details may be made therein without departing from the spirit and scope of the disclosure. For example, the techniques of the disclosed embodiments may be combined with other compression algorithms such as loudness contours to provide a combined reduction in volume when needed due to the power constraint or for signal enhancement.

What is claimed is:

1. A method of preventing clipping in a power output circuit that provides a power output signal, the method comprising:
   determining energy available from a power supply that supplies the power output circuit by determining a stored energy in an output storage capacitance of the power supply, determining an input energy available to an input of the power supply, and combining the input energy available to the input of the power supply and the stored energy in the output storage capacitance to determine an energy available to the power output circuit;
   calculating an energy requirement for producing the power output signal; and
   adjusting an amplitude of the power output signal in conformity with the determined energy available to the power output circuit so that the power output signal is reproduced without clipping of the power output signal.

2. The method of claim 1, wherein the power output circuit is an audio power output circuit for supplying an audio power output signal to an electro-acoustic output transducer.

3. The method of claim 1, further comprising buffering samples of an input signal that is reproduced by the power output circuit to provide the power output signal in a buffer, and wherein the calculating an energy requirement computes the energy requirement based upon the samples of the input signal in the buffer.

4. The method of claim 1, further comprising comparing the energy requirement to the energy available to the power output circuit to determine a gain or attenuation value to apply to the power output signal.

5. The method of claim 1, further comprising estimating a capacitance value of the output storage capacitance, and wherein the determining the stored energy in the output storage capacitance of the power supply determines the stored energy using the estimated capacitance value.

6. The method of claim 5, wherein the estimating a capacitance of the output storage capacitance computes the capacitance from conservation of a power supplied from the output storage capacitance, a power supplied to the input of the power supply and a power supplied to the power output circuit.

7. The method of claim 6, further comprising measuring a voltage across the output storage capacitance, wherein the power supplied from the output storage capacitance is determined from the estimated capacitance value and changes in the measured voltage.

8. The method of claim 7, wherein the power supplied to the input of the power supply is computed from a current limit value of the power supply and from a voltage across the input of the power supply while the input of the power supply is in a current-limited condition, and wherein the estimating a capacitance of the output storage capacitance computes the capacitance only while the power supply is in a current-limited condition.

9. The method of claim 6, further comprising:
determining an error in the estimated capacitance value by subtracting the power supplied to the input of the power supply and the power supplied from the output storage capacitance, according to the estimated capacitance value, from power values representing power delivered to the power output circuit;
accumulating a result of the subtracting to produce an energy error value; and
updating the estimated capacitance value in conformity with the energy error value.

10. The method of claim 9, wherein the determining an error and the updating are performed so that variation in the capacitance of the output storage capacitance is modeled over time and compensated for in the determining of the energy available from the power supply.

11. A system that provides a power output signal to an output transducer based on a program, the system comprising:
a power supply;
a buffer for storing samples of the program;
a power output circuit that generates the power output signal from the samples of the program; and
a processing subsystem that determines an energy requirement for producing the power output signal from the program and adjusts an amplitude of the power output signal in conformity with the determined energy requirement and an available energy determined for the power supply so that the power output signal is reproduced without clipping of the power output signal, wherein the processing subsystem determines the available energy by determining a stored energy in an output storage capacitance of the power supply, determining an input energy available to an input of the power supply, and combining the input energy available to the input of the power supply and the stored energy in the output storage capacitance to determine an energy available to the power output circuit, and wherein the processing subsystem adjusts the amplitude of the power output signal in conformity with the determined available energy.

12. The system of claim 11, wherein the power output circuit is an audio power output circuit for supplying an audio power output signal to an electro-acoustic output transducer, and wherein the program is an audio program.

13. The system of claim 11, wherein the processing subsystem calculates the energy requirement based upon the samples of the program stored in the buffer.

14. The system of claim 13, wherein the processing subsystem compares the energy requirement to the energy available to the power output circuit to determine a gain or attenuation value to apply to the power output signal.

15. The system of claim 11, wherein the processing subsystem estimates a capacitance value of the output storage capacitance and determines the stored energy in the output storage capacitance using the estimated capacitance value.

16. The system of claim 15, wherein the processing subsystem computes the capacitance value from conservation of a power supplied from the output storage capacitance, a power supplied to the input of the power supply, and a power supplied to the power output circuit.

17. The system of claim 16, further comprising a voltage measuring circuit for measuring a voltage across the output storage capacitance, wherein the power supplied from the output storage capacitance is determined from the computed capacitance value and changes in the measured voltage.

18. The system of claim 17, wherein processing subsystem computes the power supplied to the input of the power supply from a current limit value of the power supply and from a voltage across the input of the power supply while the input of the power supply is in a current-limited condition, and wherein the processing subsystem computes the capacitance value only while the power supply is in a current-limited condition.

19. The system of claim 16, wherein the processing subsystem further determines an error in the estimated capacitance value by subtracting the power supplied to the input of the power supply and the power supplied from the output storage capacitance, according to the estimated capacitance value, from power values representing power delivered to the power output circuit, wherein the processing subsystem accumulates a result of the subtracting to produce an energy error value, and updates the estimated capacitance value in conformity with the energy error value.

20. The system of claim 19, wherein the processing subsystem updates the estimated capacitance value so that variation in the capacitance of the output storage capacitance is modeled over time and compensated for when determining the energy available from the power supply.

21. A system that provides an audio power output signal to an audio output transducer based on an audio program, the system comprising:
a power supply;
a buffer for storing samples of the audio program;
an audio power output circuit that generates the audio power output signal from the samples of the audio program; and
a processing subsystem that determines an energy requirement for producing the audio power output signal from the audio program and adjusts an amplitude of the audio power output signal in conformity with the determined energy requirement and an available energy determined for the power supply so that the audio power output signal is reproduced without clipping of the audio power output signal, wherein the processing subsystem determines the available energy by determining a stored energy in an output storage capacitance of the power supply, determining an input energy available to an input of the power supply, and combining the input energy available to the input of the power supply and the stored energy in the output storage capacitance to determine an energy available to the audio power output circuit, and wherein the processing subsystem adjusts the amplitude of the audio power output signal in conformity with the determined available energy.

* * * * *